(12) United States Patent
Azam

(10) Patent No.: US 6,924,670 B2
(45) Date of Patent: Aug. 2, 2005

(54) COMPLEMENTARY INPUT DYNAMIC MUXED-DECODER

(75) Inventor: Mir Azam, Austin, TX (US)

(73) Assignee: IP-First, LLC, Fremont, CA (US)

( * ) Notice: Subject to any disclaimer, the term of this patent is extended or adjusted under 35 U.S.C. 154(b) by 138 days.

(21) Appl. No.: 10/395,306

(22) Filed: Mar. 21, 2003

(65) Prior Publication Data

US 2004/0056687 A1 Mar. 25, 2004

Related U.S. Application Data

(60) Provisional application No. 60/412,110, filed on Sep. 19, 2002, and provisional application No. 60/412,112, filed on Sep. 19, 2002.

(51) Int. Cl.[7] .................................................. G11C 8/00
(52) U.S. Cl. ........................ 326/106; 326/98; 326/121; 365/230.06
(58) Field of Search ................................. 326/105–108, 326/93, 95, 98; 365/230.06

(56) References Cited

U.S. PATENT DOCUMENTS

| | | | |
|---|---|---|---|
| 5,015,882 A | 5/1991 | Houston et al. | |
| 5,399,921 A | 3/1995 | Dobbelaere | |
| 5,440,243 A | 8/1995 | Lyon | |
| 5,525,916 A | 6/1996 | Gu et al. | |
| 6,081,136 A | 6/2000 | Khanna et al. | |
| 6,388,489 B1 | 5/2002 | Fetzer et al. | |
| 6,486,706 B2 * | 11/2002 | Ye et al. ........................ | 326/98 |
| 6,549,060 B1 | 4/2003 | Mellinger et al. | |
| 6,707,753 B2 * | 3/2004 | Clark et al. ............ | 365/230.06 |
| 2002/0021145 A1 | 2/2002 | Deng | |
| 2002/0024358 A1 | 2/2002 | Deng | |

OTHER PUBLICATIONS

Samuel D. Naffziger, Glenn Colon–Bonet, Timothy Fischer, Reid Riedlinger, Thomas J. Sullivan, and Tom Grutkowski; "The Implementation of the itanium 2 Microprocessor"; IEEE Journal of Solid–State Circuit; vol. 37, No. 11; Nov. 2002; S.D. Naffziger, G. Colon–Bonet, T. Fischer, R. Riedlinger, and T.J. Sullivan are with Hewlett Packard Company, Ft. Collins, CO USA; T. Grutkowski is with the Intel Corporation, Santa Clara, CA 80525 USA.

* cited by examiner

Primary Examiner—James H. Cho
(74) Attorney, Agent, or Firm—Gary R. Stanford; Richard K. Huffman; James W. Huffman (57) ABSTRACT

A muxed-decoder circuit including multiple complementary input dynamic circuits and an AND logic gate. Each complementary input dynamic circuit includes a complementary P-logic AND dynamic circuit, a complementary N-logic AND dynamic circuit and a pass device. The complementary P-logic AND dynamic circuit has an output coupled to a corresponding output evaluation node, and evaluates bits of an encoded address value corresponding and bits of a digital select value having a logic state for selecting the encoded address. The complementary N-logic AND dynamic circuit has an output coupled to a corresponding preliminary evaluation node, and evaluates inverted bits of the address value and the digital select value. The pass device is coupled between corresponding first and second evaluation nodes and drives the second evaluation node low if the complementary N-logic AND dynamic circuit fails to evaluate. The AND logic gate couples to the output evaluation nodes and provides a corresponding decoded bit.

20 Claims, 9 Drawing Sheets

COMPLEMENTARY INPUT DYNAMIC MUXED-DECODER

CROSS-REFERENCE TO RELATED APPLICATIONS

This application claims the benefit of U.S. Provisional Application No. 60/412,110 filed on Sep. 19, 2002 and U.S. Provisional Application No. 60/412,112 filed on Sep. 19, 2002.

This application is related to the following co-pending U.S. patent applications, which are filed on the same day as this application, and which have a common assignee and common inventors.

| SERIAL NUMBER | DOCKET NUMBER | TITLE |
|---|---|---|
| 10/395,305 | CNTR. 2203 | COMPLEMENTARY INPUT DYNAMIC LOGIC |
| 10/395,213 | CNTR. 2205 | COMPLEMENTARY INPUT DYNAMIC LOGIC FOR COMPLEX LOGIC FUNCTIONS |

BACKGROUND OF THE INVENTION

1. Field of the Invention

The present invention relates to logic circuits, and more particularly to implementations of high fan-in complex logic functions including muxed-decoders in a dynamic logic circuit.

2. Description of the Related Art

Figure 1:
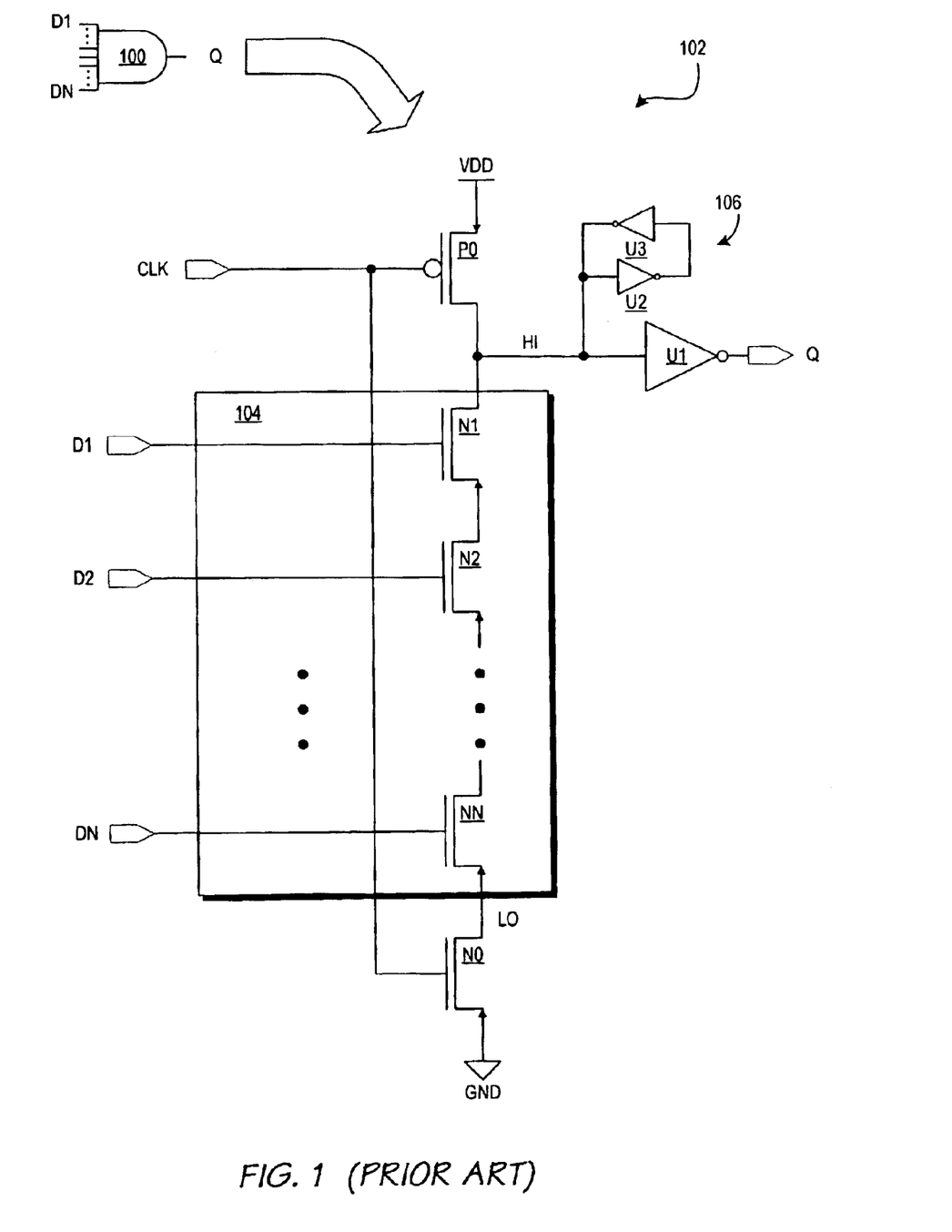
FIG. 1 is a schematic diagram of an N-input AND gate representing an AND logic function and a corresponding exemplary dynamic circuit for implementing the N-input AND gate.

Dynamic circuits are frequently used to implement logic functions in present day pipelined systems because of speed demands. FIG. 1 is a schematic diagram of an AND gate 100 representing an AND logic function and an exemplary dynamic circuit 102 for implementing the AND gate 100. The dynamic circuit 102 and the AND gate 100 each are shown having "N" inputs, individually shown as D1, D2, . . . , DN, and a single output referred to as "Q". The dynamic circuit 102 includes a P-channel header device P0, an N-channel footer device N0, a logic function for evaluation implemented by a logic circuit 104, an output buffer or inverter/driver U1, and a storage or keeper circuit 106. In the embodiment shown, the keeper circuit 106 is implemented with inverter devices U2 and U3, in which the output of U2 is coupled to the input of U3 and vice-versa.

The dynamic circuit 102 establishes the Q signal at the output of the inverter/driver U1 on a rising edge of an associated clock signal "CLK". The dynamic nature of a dynamic logic circuit is controlled by the CLK signal in which the circuit is in a set-up or pre-charged state while CLK is negated low and in an evaluation state when CLK is asserted high. The CLK signal is provided to respective gates of the header device P0 and the footer device N0. The header device P0 has a source coupled to a source voltage "VDD" and a drain coupled to an evaluation node referred to as "HI". It is noted that a node and its corresponding signal are referred to herein by the same name, e.g., node HI carries the HI signal. The footer device N0 has a source coupled to a common reference voltage "GND" and a drain coupled to a reference node referred to as "LO". The logic circuit 104 is coupled between the HI and LO nodes. In the embodiment shown, the logic circuit 104 is implemented in N-channel logic, or "N-logic", using a number "N" of N-channel devices N1–NN coupled in series between the HI and LO nodes. In particular, a first N-channel device N1 has its drain coupled to HI and its source coupled to the drain of the next N-channel device N2, and so on down to a last N-channel device NN having its source coupled to LO. Each of the N inputs D1–DN is provided to a respective one of the N-channel devices N1–NN. The HI node is further coupled to the inputs of the inverter devices U1 and U2 and to the output of the inverter device U3.

In operation, while the CLK signal is low, the HI node is pre-charged to a logic high level by the header device P0, the Q signal is pulled low via the inverter/driver U1 and the input signals D1–DN setup for evaluation of the logic function. When the CLK signal goes high, based on the state of the inputs D1–DN, the logic function of the logic circuit 104 either evaluates or "fails" to evaluate. If the logic circuit 104 evaluates, in which all of the input signals D1–DN are asserted high turning on all of the N-channel devices N1–NN, the logic circuit 104 drives the HI node to a logic low level via the activated footer device N0 and the Q output signal is driven to a logic high level. Once the HI node is driven low, it stays low until the CLK signal is driven low again. If the logic circuit 104 fails to evaluate, the keeper circuit 106 maintains the HI node at a high logic level, so that the Q signal remains low. Hence, the Q signal is low when the CLK signal is low, and the Q signal can be driven high by the logic circuit 104 while the CLK signal is high if the logic function is TRUE.

The logic function implemented by the logic circuit 104 is a multiple-input AND function. To evaluate, all of the inputs D1–DN must be at a logic high level while the CLK signal is high. AND logic functions are typically implemented in N-logic by connecting N-channel devices in series as shown within the logic circuit 104. Such series or "stack" connections of N-channel devices causes problems in a dynamic circuit for at least two reasons. First, the length of the evaluation path between the HI and LO nodes is a function the number of devices in the evaluation path of the logic circuit which is, in turn, a function of the fan-in (i.e., the number of inputs to be ANDed together). Long evaluation paths required to evaluate a relatively large number of input signals requires a longer time to evaluate, thus slowing down the overall circuit. Second, because N-channel devices are employed to implement the evaluation function, devices higher in the stack are subject to device body effects. Device body effects cause the device thresholds to change due to stacking, thus providing the potential for instability of the circuit.

To address the problems associated with the length of the evaluation path, logic designers usually limit the size of each stack to no more than about four levels. In general, evaluation paths with two levels is a desirable configuration. The solution of limiting the evaluation path may be accomplished by either implementing the inverse function using OR terms or decomposing high fan-in AND functions into a staged series of low fan-in AND functions.

Implementing the inverse of an AND function involves converting the series AND path to a parallel OR path with parallel OR terms. The solution of inverting to the OR logic function suffices for simple functions in which an inverted output is acceptable. The inversion solution is unworkable under complex logic conditions, however, since converting AND terms to OR terms in a first stage of a logic operation necessitates that OR terms in a following stage be converted to AND terms. Consequently, inversion merely relegates the N-stack problem to the following logic stage.

Figure 2:
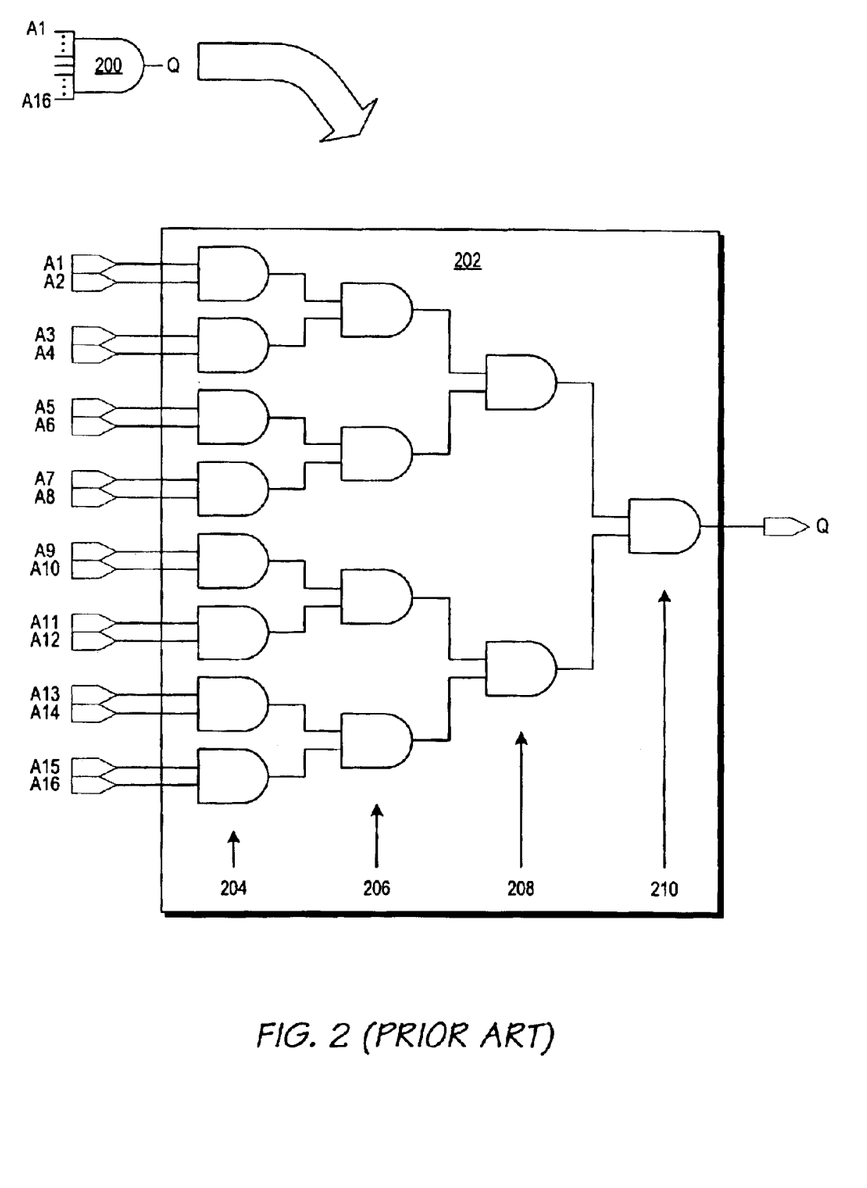
FIG. 2 is a schematic diagram of a 16-input AND gate and an exemplary logic circuit for implementing the 16-input AND gate illustrating a conventional decomposition solution.

FIG. 2 is a schematic diagram of a 16-input AND gate 200 and an exemplary logic circuit 202 for implementing the AND gate 200 illustrating a conventional decomposition solution. The AND gate 200 has 16 input signals, individually shown as A1–A16, and an output signal Q, and is considered a high fan-in AND function. The single AND gate 200 is implemented by a series of four low fan-in stages 204, 206, 208 and 210, each stage including one or more 2-input AND gates. In particular, the first stage 204 includes eight AND gates, each receiving a respective pair of the input signals A1–A16. The second stage 206 includes four AND gates, each having a pair of inputs coupled to respective outputs of pairs of AND gates of the first stage 204. The third stage 208 includes two AND gates, each having a pair of inputs coupled to respective outputs of pairs of AND gates of the second stage 206. The fourth and final stage 210 includes a single AND gate having a pair of inputs coupled to respective outputs of the two AND gates of the third stage 208.

It is noted that each AND function of the logic circuit 202 has only two inputs so that the respective evaluation paths are decomposed to the desirable configuration with low fan-in. Decomposing a high fan-in AND function into staged low fan-in AND operations is undesirable, nevertheless, because each additional series-coupled stage of the decomposed function adds delay to the overall circuit. The number of AND gates may be decreased by increasing the fan-in per AND gate, such as down to only five 4-input AND gates, each with the maximum number of recommended fan-ins of four. This latter solution still suffers from delay, however, since each AND function has a relatively large fan-in and two stages are still required.

SUMMARY OF THE INVENTION

A muxed-decoder circuit according to an embodiment of the present invention includes multiple complementary input dynamic circuits and an AND logic gate. Each complementary input dynamic circuit is associated with a corresponding one of several multi-bit encoded addresses and with a corresponding decoded output bit. Each complementary input dynamic circuit includes a complementary P-logic AND dynamic circuit, a complementary N-logic AND dynamic circuit and a pass device. The complementary P-logic AND dynamic circuit has an output coupled to a corresponding one of multiple output evaluation nodes, and in response to a clock signal, evaluates bits of an address value corresponding to an encoded address and bits of a digital select value having a logic state for selecting the encoded address. The complementary N-logic AND dynamic circuit has an output coupled to a corresponding one of multiple preliminary evaluation nodes, and in response to the clock signal, evaluates inverted bits of the address value and the digital select value. The pass device is coupled between corresponding first and second evaluation nodes and drives the second evaluation node low if the complementary N-logic AND dynamic circuit fails to evaluate. The AND logic gate has multiple inputs for coupling to the output evaluation nodes and an output for providing a corresponding decoded bit.

The AND gate may be a NAND gate. The muxed-decoder may include one or more inverter/drivers, each having an input receiving the clock signal and an output providing an inverted clock signal to a pass device. The complementary N-logic AND dynamic circuit may include a plurality of N-channel devices coupled in parallel, each having an input for receiving either one of a select bit and an address bit. The complementary P-logic dynamic circuit may include a plurality of P-channel devices coupled in parallel, each having an input for receiving either one of a select bit and an address bit.

A method of selecting from among a plurality of multi-bit encoded addresses and decoding at least one bit of a selected address according to an embodiment of the present invention includes combining each bit of a select value having a logic state for selecting a corresponding address with the bits of the corresponding address forming a plurality of sets of AND terms, evaluating a complement of an AND logic function for each set of AND terms using a plurality of complementary N-logic circuits, pulling, by each complementary N-logic circuit, a corresponding first evaluation node low if the corresponding complementary N-logic circuit evaluates, evaluating a complement of an AND logic function for each set of AND terms using a plurality of complementary P-logic circuits, pulling, by each complementary P-logic circuit, a corresponding second evaluation node high if the P-logic circuit evaluates, pulling a corresponding second evaluation node low via a corresponding pass device controlled by a corresponding first evaluation nodes for every corresponding complementary N-logic circuit that fails to evaluate, and combining the second evaluation nodes using a gate to provide a decoded bit.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventor of the present application has recognized the need for implementing high fan-in complex logic functions in a dynamic circuit, where the implementation does not incur body effects and latencies that have heretofore been associated with dynamic logic implementations that have a significant number of input terms. He has therefore developed a complementary input dynamic logic circuit that facilitates a substantial number of input terms without incurring body effects associated with high stacks or the latencies associated with AND term decomposition, as will be further described below with respect to FIGS. 3–10.

Figure 3:
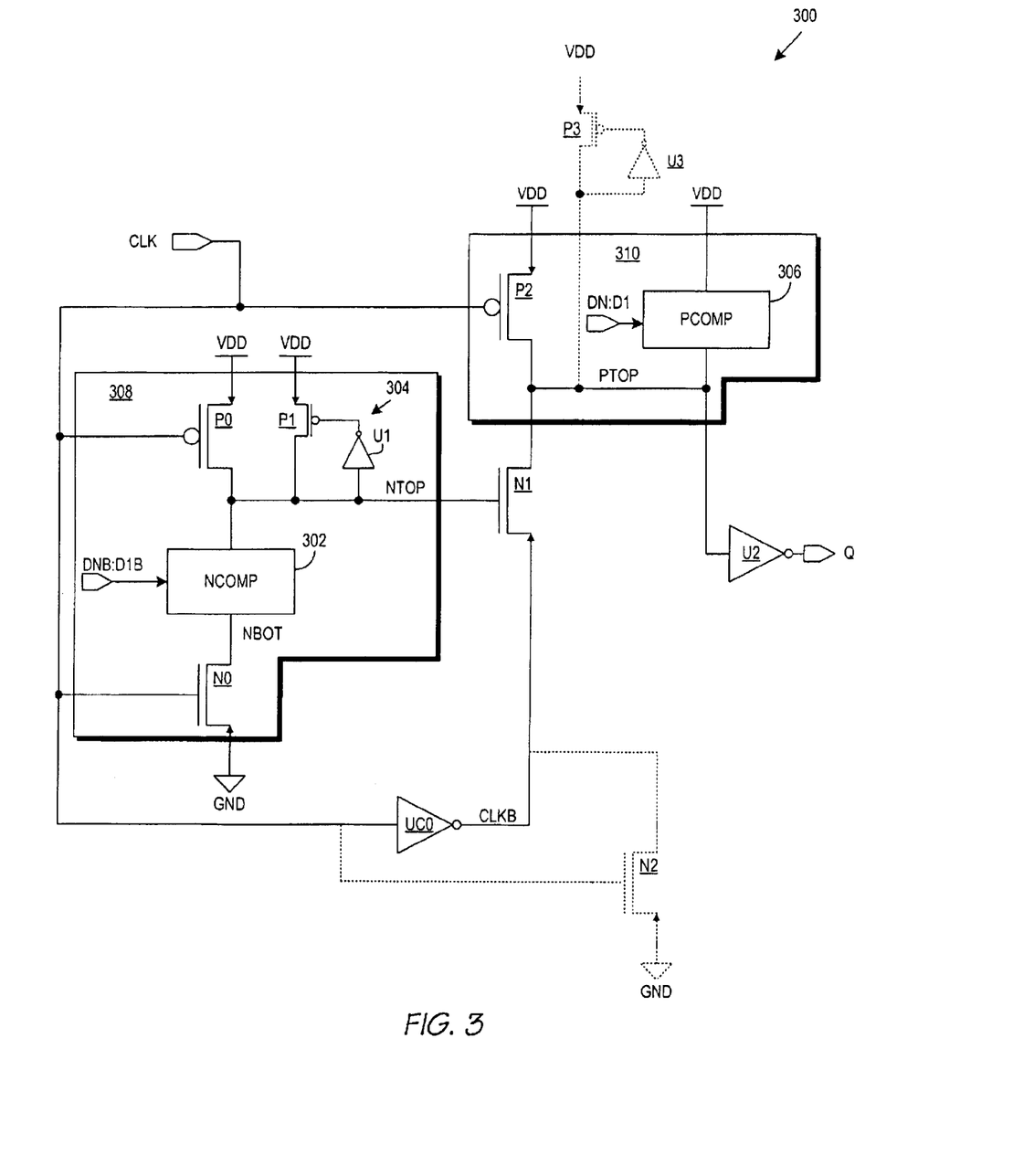
FIG. 3 is a schematic diagram of an exemplary complementary input dynamic logic circuit implemented according to an embodiment of the present invention.

FIG. 3 is a schematic diagram of an exemplary complementary input dynamic logic circuit 300 implemented according to an embodiment of the present invention. The CLK signal is provided to the gates of a P-channel header device P0 and an N-channel footer device N0. The header device P0 has a source coupled to the source voltage VDD and a drain coupled to a first, preliminary evaluation node "NTOP". The footer device No has its drain coupled to a reference node "NBOT" and its source coupled to the common reference voltage node GND. A complement of a logic function for evaluation is implemented in N-logic shown as NCOMP 302, which has an output coupled to the NTOP node and a reference node coupled to the NBOT node. NCOMP 302 receives inverted versions of N input signals D1–DN, shown as DNB:D1B, where the letter "B" appended to a signal name denotes logical inversion (e.g., logic "1" or TRUE inverted to logic "0" or FALSE and vice-versa) unless otherwise specified. It is noted that D1B–DNB and DNB:D1B are different notations for the same set of N signals, where N is a positive integer greater than 1. A storage circuit 304 is coupled between VDD and NTOP. In the embodiment shown, the storage circuit 304 is implemented as a half-keeper 304, including an inverter U1 and a P-channel device P1. The inverter U1 has its input coupled to NTOP and its output coupled to the gate of the device P1, which has its source coupled to VCC and its drain coupled to NTOP.

The CLK signal is also provided to the gate of another P-channel device P2 and to the input of an inverter/driver UC0. P2 has its source coupled to VDD and its drain coupled to a second or output evaluation node "PTOP". The inverter/buffer UC0 asserts an inverted version of the clock signal CLK, or "CLKB", at its output, which is coupled to the source of an N-channel pass device N1. N1 has its gate coupled to NTOP and its drain coupled to PTOP. A complement of the logic function for evaluation by NCOMP 302 is implemented in P-logic shown as PCOMP 306, which has a reference node coupled to VDD and an output coupled to the PTOP node. PCOMP 306 receives the N input signals DN:D1, and implements in "P-logic" (i.e., employing P-channel devices) a complement of the logic function implemented in N-logic as NCOMP 302. PTOP is provided to the input of an output inverter/driver U2, which asserts an output signal "Q" at its output.

In operation, the CLK signal is initially asserted low, so that the PTOP output evaluation node is pre-charged high through the header device P2 and the NTOP preliminary evaluation node is pre-charged high through the header device P0. The Q output signal is initially low. When the CLK signal is asserted high, NCOMP 302 and PCOMP 306 evaluate the input signals DNB:D1B and DN:D1, respectively, for determining or otherwise controlling the state of the NTOP and PTOP nodes. NCOMP 302 and PCOMP 306 both implement complements of the same logic function, so that both either evaluate or fail to evaluate while CLK is high. The logic function itself is TRUE when NCOMP 302 and PCOMP 306 both are FALSE, that is, when both NCOMP 302 and PCOMP 306 fail to evaluate. The logic function itself is FALSE when NCOMP 302 and PCOMP 306 both evaluate.

Thus, when the logic function is TRUE and both NCOMP 302 and PCOMP 306 fail to evaluate, NTOP remains high via operation of the keeper circuit 304. Since NTOP remains high, the pass device N1 remains activated or on. The buffered CLKB signal asserted by the inverter/driver UC0 is low and is passed through the pass device N1 to discharge PTOP low, so that Q goes high (TRUE) indicating that the logic function is TRUE. In this manner, when the pass device N1 remains on as controlled by NTOP, the inverter UC0 pulls down the evaluation node PTOP through, at most, a two N-device path, thus causing a logic TRUE state to be asserted by the Q output signal. The two N-channel devices are specifically an N-channel device (not shown) within the inverter UC0 and the pass device N1. If the logic function is FALSE, then both NCOMP 302 and PCOMP 306 evaluate so that NTOP is pulled low through the footer device N0 and PTOP is pulled high by PCOMP 306. The pass device N1 is de-activated or turned off, so that PTOP remains high. The Q output signal remains low (FALSE) indicating that the logic function is FALSE.

Unlike a pure domino circuit, the complementary input dynamic logic circuit 300 allows its output to be driven high during evaluation, but unlike a domino circuit, if the input signals arrive late, the output signal Q can still be driven back low if both NCOMP 302 and PCOMP 306 evaluate while the CLK signal is high. The complementary input dynamic logic circuit 300 can be viewed as including a complementary N-channel logic circuit 308 associated with the first, preliminary evaluation node NTOP and a complementary P-channel logic circuit 310 associated with the second, output evaluation node PTOP, where PTOP is used to develop the output signal Q via the inverter/driver U2. The complementary N-channel logic circuit 308 includes the header and footer devices P0 and N0, the complementary N-logic circuit NCOMP 302 for logic function evaluation and the keeper circuit 304. The complementary P-channel logic circuit 310 includes the header device P2 and the complementary P-logic circuit PCOMP 306 for logic function evaluation. If both complementary logic circuits 308 and 310 evaluate, then NTOP is driven low by the circuit 308 and PTOP is driven high by the circuit 310. The pass device N1 is provided and controlled by NTOP to pass an inverted and buffered version of the CLK signal (developed by the inverter/driver UC0) to drive PTOP low if both circuits 308 and 310 fail to evaluate.

An alternative embodiment contemplates substitution of an N-channel device N2 for inverter UC0 as is shown in FIG. 3 via dotted line interconnections. The source node of N2 is coupled to a ground reference, the drain node of N2 is coupled to the source node of bypass device N1, and the gate node of N2 is coupled to signal CLK. Consequently, when CLK is at a high level, N2 turns on, pulling the drain of N1 to a low level. If NCOMP 302 and PCOMP 306 fail to evaluate, then the low level is propagated through N1 to signal PTOP, thus providing a high level output Q.

A stable reference for signal PTOP is supplemented by a weak keeper circuit comprised by devices P3 and U3. These devices are shown via dotted interconnections because they are recommended, but not required. Instead of the half keeper configuration, a full keeper, comprising two inverters as shown in FIG. 1, will provide a stable reference for PTOP as well.

The alternative pull-down device N2 as a substitute for inverter UC0 and the recommended addition of the weak keeper circuit to provide a stable reference to node PTOP apply to all subsequent embodiments of the present invention as will herein be described.

Figure 4:
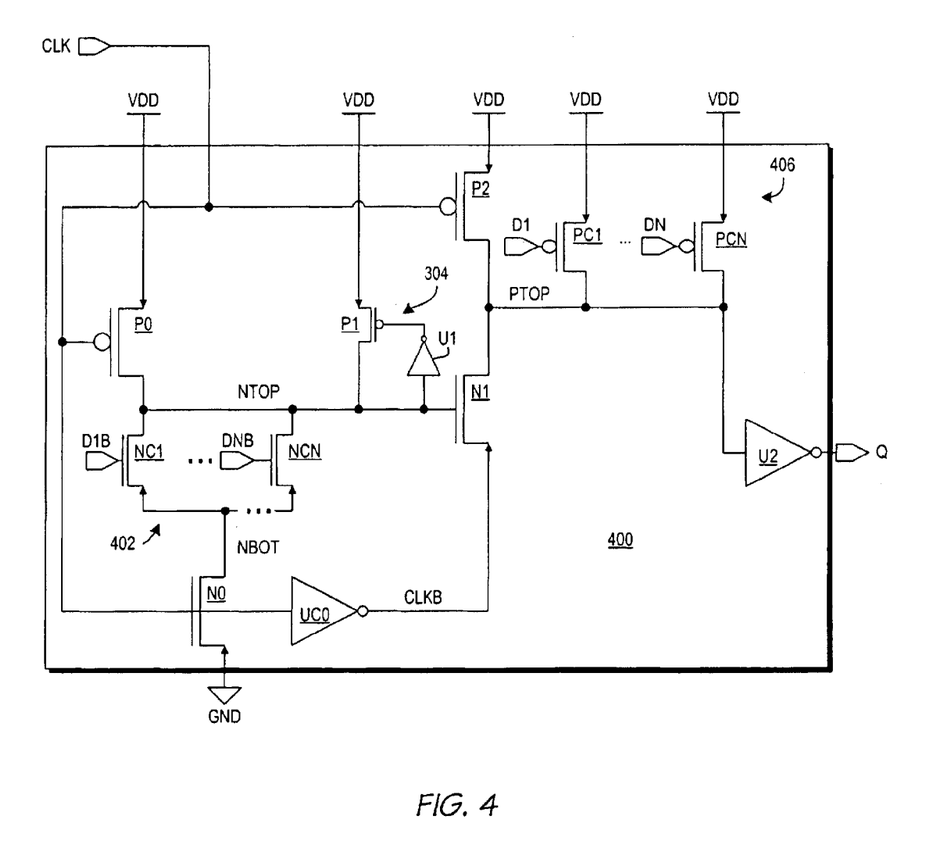
FIG. 4 is a schematic diagram of an exemplary complementary input dynamic logic circuit implemented according to a more specific embodiment for implementing an AND logic function.

FIG. 4 is a schematic diagram of an exemplary complementary input dynamic logic circuit 400 implemented according to a more specific embodiment of the present invention for implementing an AND logic function. The complementary input dynamic logic circuit 400 is substantially similar to the complementary input dynamic logic circuit 300, in which similar components assume identical reference numerals. For the complementary input dynamic logic circuit 400, NCOMP 302 is replaced by a complementary AND N-logic circuit 402 and PCOMP 306 is replaced by a complementary AND P-logic circuit 406. In other words, the complementary input dynamic logic circuit 400 is the same as complementary input dynamic logic circuit 300 except specifically implemented to evaluate an AND logic function. It is noted that the complementary input dynamic logic circuit 400 can be converted to perform the NAND logic function simply by replacing the inverter/driver U2 with a driver or buffer removing the inverting function or by adding another inverter/driver (not shown) at the output of U2.

The complementary AND N-logic circuit 402 is implemented in N-logic using N N-channel devices NC1–NCN coupled in parallel between NTOP and NBOT and implements a complement of an AND function in N-logic. Yet, when complemented inputs D1B–DNB are provided, the result is the desired logical AND of inputs D1–DN. In a similar manner, the complementary AND P-logic circuit 406 is implemented in P-logic using N P-channel devices PC1–PCN coupled in parallel between VDD and PTOP and implements another complement of the AND function. The input signal complements D1B–DNB are provided to the gates of the N-channel devices NC1–NCN, respectively (e.g. D1B is provided to the gate of NC1, D2B is provided to the gate of NC2, etc.), and the uncomplemented input signals D1–DN are provided to the gates of the P-channel devices PC1–PCN, respectively (e.g. D1 is provided to the gate of PC1, D2 is provided to the gate of PC2, etc.).

Operation of the complementary input dynamic logic circuit 400 is similar to and corresponds with the operation described above in reference to the complementary input dynamic logic circuit 300. The complementary AND logic circuits 402 and 406 both evaluate if any one or more of the D1–DN input signals are FALSE or low (e.g., logic "0"), such that the corresponding signal(s) of the D1B–DNB input signals are TRUE or high (e.g., logic "1"). If both of the complementary AND logic circuits 402 and 406 evaluate, then the AND function is FALSE, so that the Q output signal becomes FALSE (asserted low) when the CLK signal is asserted high. Alternatively, the complementary AND logic circuits 402 and 406 both fail to evaluate if all of the DL–DN input signals are TRUE, such that the corresponding signal(s) of the D1B–DNB input signals are FALSE. If both of the complementary AND logic circuits 402 and 406 fail to evaluate, then the AND function is TRUE, so that the Q output signal becomes TRUE (asserted high) when the CLK signal is asserted high. It is significant to note that the speed of the circuit of FIG. 4 is insensitive to fan-in; any feasible number of inputs to the AND function can be employed without slowing down the circuit. This is because the evaluation path is only through two stacked N devices: N1 and the N device (not detailed) within UC0.

Figure 5:
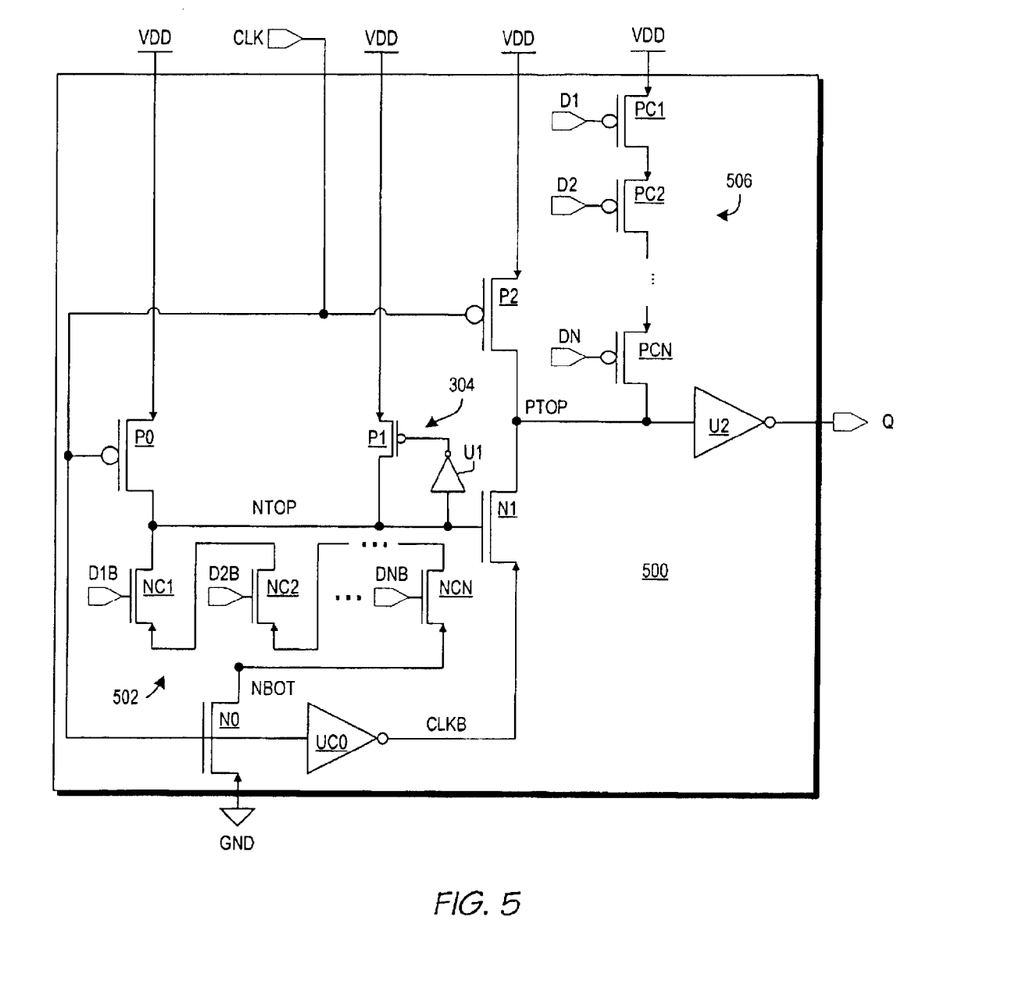
FIG. 5 is a schematic diagram of an exemplary complementary input dynamic logic circuit according to another specific embodiment for implementing an OR logic function.

FIG. 5 is a schematic diagram of an exemplary complementary input dynamic logic circuit 500 according to another specific embodiment of the present invention for implementing an OR logic function. The complementary input dynamic logic circuit 500 is substantially similar to the complementary input dynamic logic circuit 300, in which similar components assume identical reference numerals, except that NCOMP 302 is replaced by a complementary OR N-logic circuit 502 and PCOMP 306 is replaced by a complementary OR P-logic circuit 506. In other words, the complementary input dynamic logic circuit 500 is similar to the complementary input dynamic logic circuit 300, except specifically implemented to evaluate the OR logic function.

The complementary OR N-logic circuit 502 is implemented in N-logic using N N-channel devices NC1–NCN coupled in series between NTOP and NBOT and implements a complement of the OR function in N logic, which is driven by complemented inputs D1B–DNB. In a similar manner, the complementary OR P-logic circuit 506 is implemented in P-logic using N P-channel devices PC1–PCN coupled in series between VDD and PTOP and implements a complement of the OR function in P logic, which is driven by true inputs D1–DN. Accordingly, the input signals D1B–DNB are provided to the gates of the N-channel devices NC1–NCN, respectively, and the input signals D1–DN are provided to the gates of the P-channel devices PC1–PCN, respectively.

The complementary OR logic circuits 502 and 506 both evaluate if all of the D1–DN input signals are FALSE, such that all of the corresponding signal(s) of the D1B–DNB input signals are TRUE. If both of the complementary OR logic circuits 502 and 506 evaluate, then the OR function is FALSE, so that the Q output signal becomes FALSE (asserted low) when the CLK signal is asserted high. Alternatively, the complementary OR logic circuits 502 and 506 both fail to evaluate if any one or more of the D1–DN input signals are TRUE, such that the corresponding signal(s) of the D1B–DNB input signals are FALSE. If both of the complementary AND logic circuits 402 and 406 fail to evaluate, then the OR function is TRUE, so that the Q output signal becomes TRUE (asserted high) when the CLK signal is asserted high.

Several benefits and advantages are realized when employing the complementary input dynamic logic circuit 300 and its associated forms, such as the complementary input dynamic logic circuit 400. The complementary input dynamic logic circuit 300 is particularly suitable for high fan-in AND applications such as are employed in decoding circuits. As noted above in the discussion with reference to FIG. 4, the complementary input dynamic logic circuits 300 and 400 are significantly faster than that which has been heretofore provided because the output evaluation path is a maximum of two devices. In comparison to present day decomposition techniques used to implement high fan-in AND functions, the complementary input dynamic logic circuits 300 and 400 are approximately an order of magnitude faster. The complementary input dynamic logic circuit 500 is the stacked configuration of the N-channel and P-channel devices of the complementary OR logic circuits 502 and 506, which limits the fan-in number because of body effects and latency issues.

Figure 6:
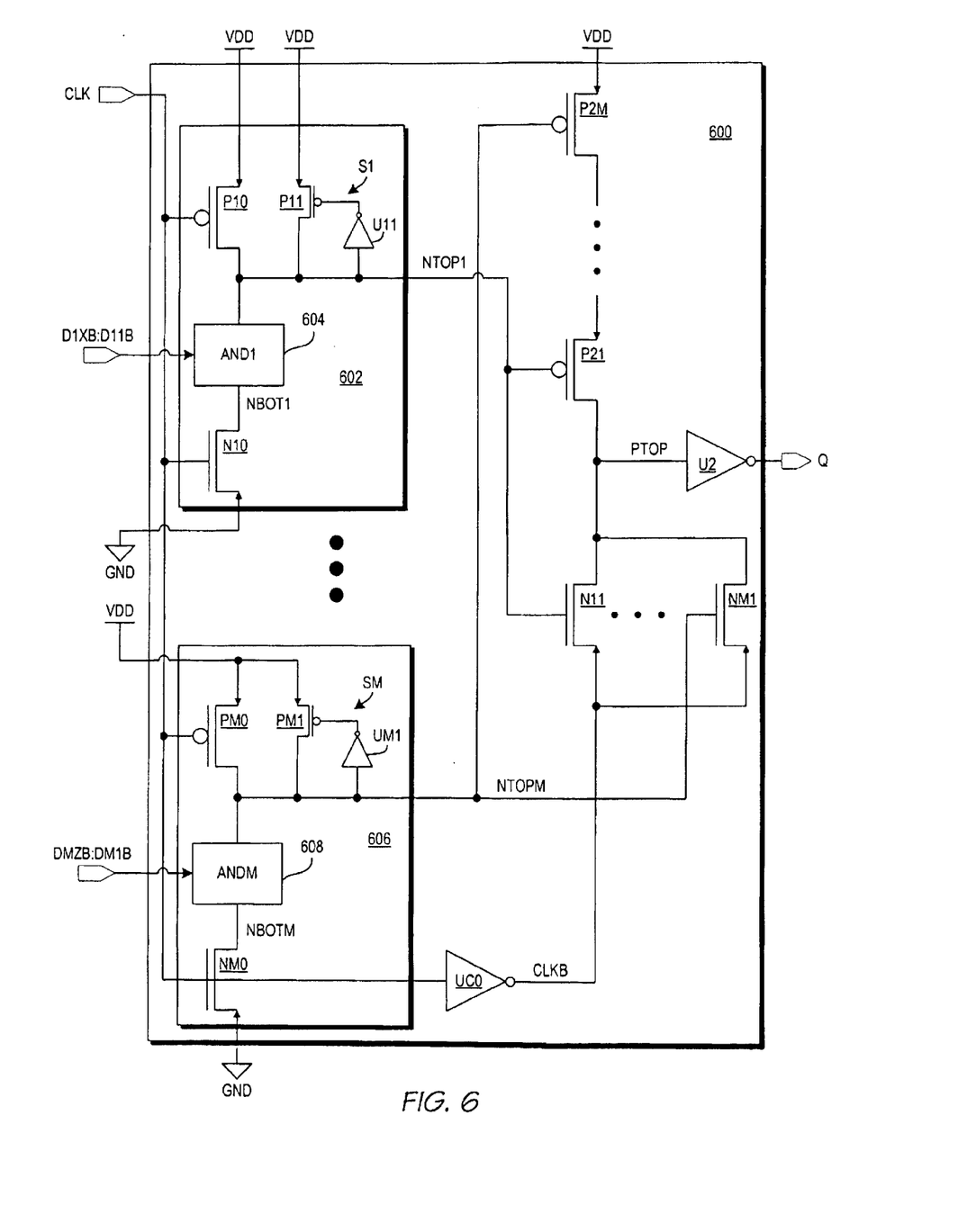
FIG. 6 is a schematic diagram of an exemplary complementary input dynamic logic circuit according to another embodiment for implementing complex logic functions.

FIG. 6 is a schematic diagram of an exemplary complementary input dynamic logic circuit 600 for implementing complex logic functions. The topology of the complementary input dynamic logic circuit 600 has some similar features as the topology of the complementary input dynamic logic circuit 300, which lends itself well to the implementation of up to approximately three to four OR terms, where each of the OR terms consists of a high fan-in logical AND function. The complex logic function implemented by the complementary input dynamic logic circuit 600 is a complex AND/OR function having the form shown by the following equation 1:

$$Q = D11 \cdot D12 \cdot \ldots D1X + D21 \cdot D22 \cdot \ldots D2Y + \ldots + DM1 \cdot DM2 \cdot \ldots DMZ \qquad (1)$$

where a dot "•" denotes the logic AND function and where a plus sign "+" denotes the logic OR function. Equation 1 is a logical OR of M multiple-input AND terms, which is an operation that is commonly found in pipelined processing systems. The first term includes "X" AND terms D11, D12, ..., D1X, the second term includes "Y" AND terms D21, D22, ..., D2Y, and so on up to the last or Mth term, which includes "Z" AND terms DM1, DM2, ..., DMZ.

The complementary input dynamic logic circuit 600 includes M complementary N-channel dynamic logic circuits, each similar to the complementary N-channel dynamic logic circuit portion of the complementary input dynamic logic circuit 300. A first complementary N-channel dynamic logic circuit 602 for implementing a first AND term "AND1" for AND terms D21, D22, ..., D2Y includes a P-channel header device P10, an N-channel footer device N10, an N-logic block 604 labeled AND1, and a storage circuit S1. The CLK signal is provided to the gates of devices P10 and N10, and inverted input signals D11B–D1XB (i.e., D1XB:D11B) are provided to respective inputs of the N-logic block 604. The header device P10 has its source coupled to VDD and its drain coupled to a first preliminary evaluation node NTOP1. The footer device N10 has its source coupled to GND and its drain coupled to a first reference node NBOT1. The N-logic block 604 has an output coupled to the NTOP1 node and a reference node coupled to the NBOT1 node and is configured in a similar manner as the AND N-logic circuit 402 including a parallel configuration of X N-channel devices, each having a gate receiving a respective one of the inverted input signals D1XB:D11B. The storage circuit S1 is implemented as a half-keeper in the same manner as the storage circuit 304, including an inverter U11 and a P-channel device P11 coupled between VDD and node NTOP1.

The remaining M-1 complementary N-channel dynamic logic circuits of the complementary input dynamic logic circuit 600 for implementing the remaining AND terms are each configured in the same manner as the first complementary N-channel dynamic logic circuit 602. As shown, a final, or Mth, complementary N-channel dynamic logic circuit 606 for implementing the last AND term "ANDM" for AND terms DM1, DM2, ..., DMZ includes a P-channel header device PM0, an N-channel footer device NM0, an N-logic block 608 labeled ANDM, and a storage circuit SM. The CLK signal is provided to the gates of devices PM0 and NM0, and inverted input signals DM1B–DMZB (DMZB:DM1B) are provided to the N-logic block 608. The header device PM0 has its source coupled to VDD and its drain coupled to a last preliminary evaluation node NTOPM. The footer device NM0 has its source coupled to GND and its drain coupled to a last reference node NBOTM. The N-logic block 608 has an output coupled to the NTOPM node and a reference node coupled to the NBOTM node and is configured in a similar manner as the AND N-logic circuit 402 including a parallel configuration of Z N-channel devices, each having a gate receiving a respective one of the inverted input signals DMZB:DM1B. The storage circuit SM is implemented as a half-keeper in the same manner as the storage circuit 304, including an inverter UM1 and a P-channel device PM1 coupled between VDD and the NTOPM node.

The M preliminary evaluation nodes NTOP1–NTOPM are each coupled to the gate of a respective one of M P-channel devices P21–P2Md and to the gate of a respective one of M N-channel pass devices N11–NM1. The P-channel devices P21–P2M are coupled in a series configuration or P-stack between VDD and an output evaluation node PTOP. In particular, a first P-channel device P21 has its drain coupled to node PTOP and its source coupled to the drain of a second P-channel device P22 (not shown), having its source coupled to the drain of a third P-channel device P23 (not shown) and so on up to the last P-channel device P2M, having its source coupled to VDD. The N-channel pass devices N11–NM1 are coupled in parallel between the PTOP node and an output of an inverter/driver UC0, which provides an inverted clock signal CLKB on a node CLKB. In particular, each of the N-channel pass devices N11–NM1 has its drain coupled to the PTOP node and its source coupled to the output of the inverter/driver UC0 to receive the CLKB signal. The inverter/driver UC0 has an input receiving the CLK signal, so that its output provides the CLKB signal. An output inverter/driver U2 has its input coupled to the PTOP node and its output providing an output signal Q.

Operation of the complementary input dynamic logic circuit 600 is described as follows. While the CLK signal is low, each of the preliminary evaluation nodes NTOP1–NTOPM are pulled high via header devices P10–PM0, respectively, activating each of the N-channel pass devices N11–NM1. The inverter/driver UC0 asserts the CLKB signal high pre-charging PTOP high, so that the Q output signal is initially asserted low. When the CLK signal is asserted high, each of the N-logic blocks AND1–ANDM evaluate their respective inputs separately yet simultaneously since they are coupled in parallel. If any one or more of the N-logic blocks AND1–ANDM fail to evaluate, then the corresponding evaluation nodes NTOP1–NTOPM remain high due to operation of the corresponding storage devices S1–SM, thereby maintaining activation of corresponding ones of the N-channel pass devices N11–NM1. When any one or more of the N-channel pass devices N11–NM1 are activated while the CLKB signal is low, the inverter/driver UC0 discharges the PTOP node low so that the Q output signal goes high (TRUE). This condition occurs when all of the inverted inputs of any one or more of the N-logic blocks AND1–ANDM are FALSE (indicating that the normal, un-inverted inputs are all TRUE), so that the complex logic function is TRUE. If all of the N-logic blocks AND1–ANDM evaluate, then the N-channel pass devices N11–NM1 are turned off while all of the P-channel device P21–P2M are turned on pulling PTOP high, so that the Q output signal goes low (FALSE). This latter condition occurs when at least one of the inverted inputs of each of the N-logic blocks AND1–ANDM is TRUE (indicating that the corresponding normal, un-inverted inputs are FALSE), so that the complex logic function is FALSE.

As compared to the complementary input dynamic logic circuit 300 of FIG. 3, instead of implementing the complement of the complex logic function in P-logic, the complementary input dynamic logic circuit 600 exploits an aspect of each of the preliminary evaluation nodes NTOP1–NTOPM. In particular, it is observed in simple complementary circuits that the P-logic complementary implementation of a desired expression logically evaluates as an alternative expression of the implemented function's complement. Thus, rather than implementing the complement of the logic function in P-logic for each of the AND terms, which would comprise parallel P-channel devices for each AND term, the NTOP1–NTOPM nodes are used as inputs to the P-logic stack of P-channel devices P21–P2M to determine the state of the output evaluation node PTOP. Consequently, M complementary P-logic blocks (one for each AND term) are each replaced by a single P-channel device, where each of the P-channel devices P21–P2M has its gate driven with a corresponding one of the evaluation nodes NTOP1–NTOPM. Thus, the resultant configuration is significantly simplified.

The complementary input dynamic logic circuit 600 does not require stacked devices in the N-channel evaluation paths of the N-logic blocks AND1–ANDM. It is noted, for example, that the configuration of the complementary input dynamic logic circuit 300 might otherwise require a stack of devices in both the N and P channel evaluation paths to realize each additional OR term in the complex function. Nonetheless, the complementary input dynamic logic circuit 600 does have stacking of the P-channel devices P21–P2M in the P-channel evaluation path, so that the maximum number of OR terms is limited by leakage issues and body effects. In the embodiment shown, the number of OR terms is limited to approximately three to four terms. The complementary input dynamic logic circuit 600 is slightly slower than the complementary input dynamic logic circuit 300 for simple circuits because the N-logic blocks AND1–ANDM all evaluate prior to driving the PTOP node. As compared to present day dynamic circuit techniques for implementing complex functions, however, the approach exemplified by the complementary input dynamic logic circuit 600 is greater than an order of magnitude faster.

Figure 7:
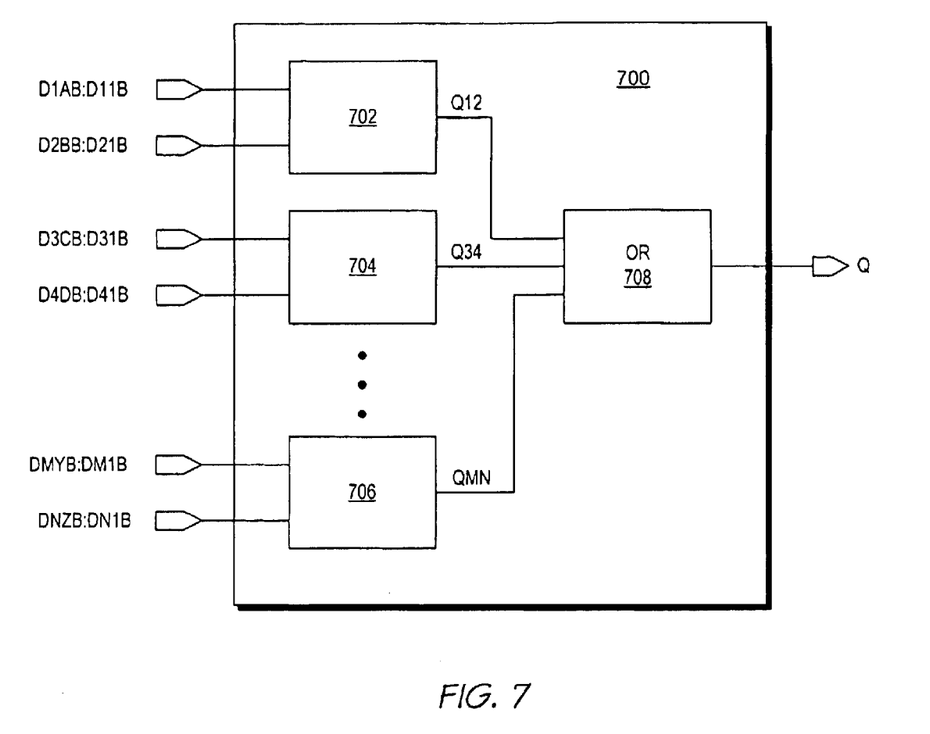
FIG. 7 is simplified block diagram of a complementary input dynamic logic circuit for implementing complex logic functions with a larger number of AND terms by including multiple complementary input dynamic logic circuits each similar to the complementary input dynamic logic circuit of FIG. 6.

FIG. 7 is simplified block diagram of a complementary input dynamic logic circuit 700 employing multiple complementary input dynamic logic circuits 702, 704, . . . , 706, each similar to the complementary input dynamic logic circuit 600 for implementing complex logic functions with a larger number of AND terms. The first logic circuit 702 handles two terms including a first term with "A" AND terms D11, D12, . . . , D1A, and a second term with "B" AND terms D21, D22, . . . , D2B. The second logic circuit 704 handles another two terms including a third term with "C" AND terms D31, D32, . . . , D3C, and a fourth term with "D" AND terms D41, D42, . . . , D4D, and so on up to the last logic circuit 706 for handling the last two Mth and Nth terms, which include "Y" and "Z" AND terms, respectively. Each of the complementary input dynamic logic circuits 702–706 handles only two AND terms for an optimal solution.

The outputs of the complementary input dynamic logic circuits 702–706 are provided to respective inputs of an OR logic gate 708, which asserts the final output value Q. As shown, logic circuit 702 provides an output Q12 to one input of the OR logic gate 708, logic circuit 704 provides an output Q34 to another input of the OR logic gate 708 and so on up to the last logic circuit 706, which provides an output QMN to another input of the OR logic gate 708. One skilled in the art will appreciate that any number of complementary input dynamic logic circuits may be stacked in parallel since the OR logic gate 708 is easily implemented with as many inputs as desired without concern for device body effects or latency. For example, the OR logic gate 708 may be implemented with N-channel devices coupled in parallel (not shown), each having a gate receiving a corresponding output of the complementary input dynamic logic circuits 702–706.

Figure 8:
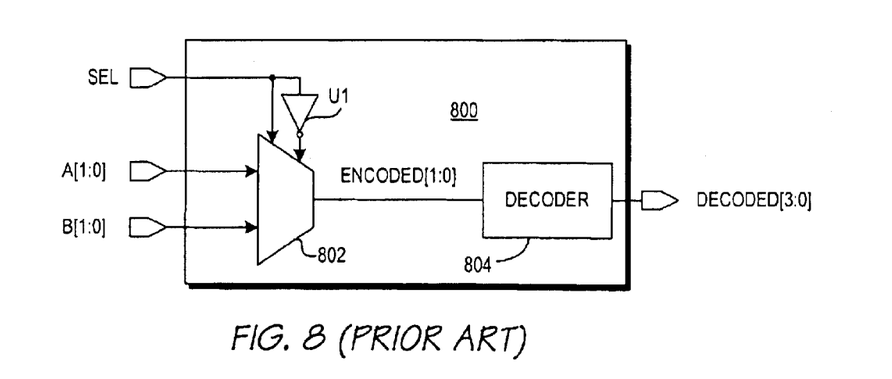
FIG. 8 is a block diagram of a conventional muxed-decoder illustrating an example of sequential AND operations commonly used in pipeline systems to select between two sets of address bits and to decode the selected set.

The complementary input dynamic logic circuit 300 is well suited to allow for combining of sequential logic operations in which the sequence of operations involves logical AND operations. FIG. 8 is a block diagram of a conventional multiplexed or "muxed" decoder 800, which is an example of sequential AND operations commonly used in pipeline systems to select between two sets of address bits and to decode the selected set. As shown, two sets of encoded bits A[1:0] and B[1:0] are provided to respective inputs of a 2-bit multiplexer (MUX) 802. The illustrated embodiment shows two bits per address, where those skilled in the art will appreciate that present day muxed-decoders typically operate on addresses having more than 2 bits. A select signal SEL is provided to a first select input of the MUX 802 and to the input of an inverter U1. The output of the inverter U1 is provided to another select input of the MUX 802. The state of the SEL signal is employed to select between the two sets of encoded address bits A[1:0] and B[1:0]. The selected bits, shown as signals ENCODED[1:0], are provided to the input of a decoder 804, which decodes the ENCODED[1:0] signals into decoded output signals DECODED[3:0].

One skilled in the art will appreciate that decoding the bits involves parallel logical AND operations to determine the state of each of the decoded outputs DECODED[3:0]. For example, the state of the DECODED[0] signal is determined by an AND operation as shown by the following equation 2:

$$\text{ENCODED}[1]\text{B} \cdot \text{ENCODED}[0]\text{B} \qquad (2)$$

where the dot symbol "•" denotes the local AND function and where the letter "B" appended to a signal name denotes logic inversion as previously described. The A[1:0] signals are selected as the ENCODED[1:0] signals by the MUX 802 if the SEL signal is asserted whereas the B[1:0] signals are selected if the SEL signal is negated, which is also a logical operation.

Figure 9:
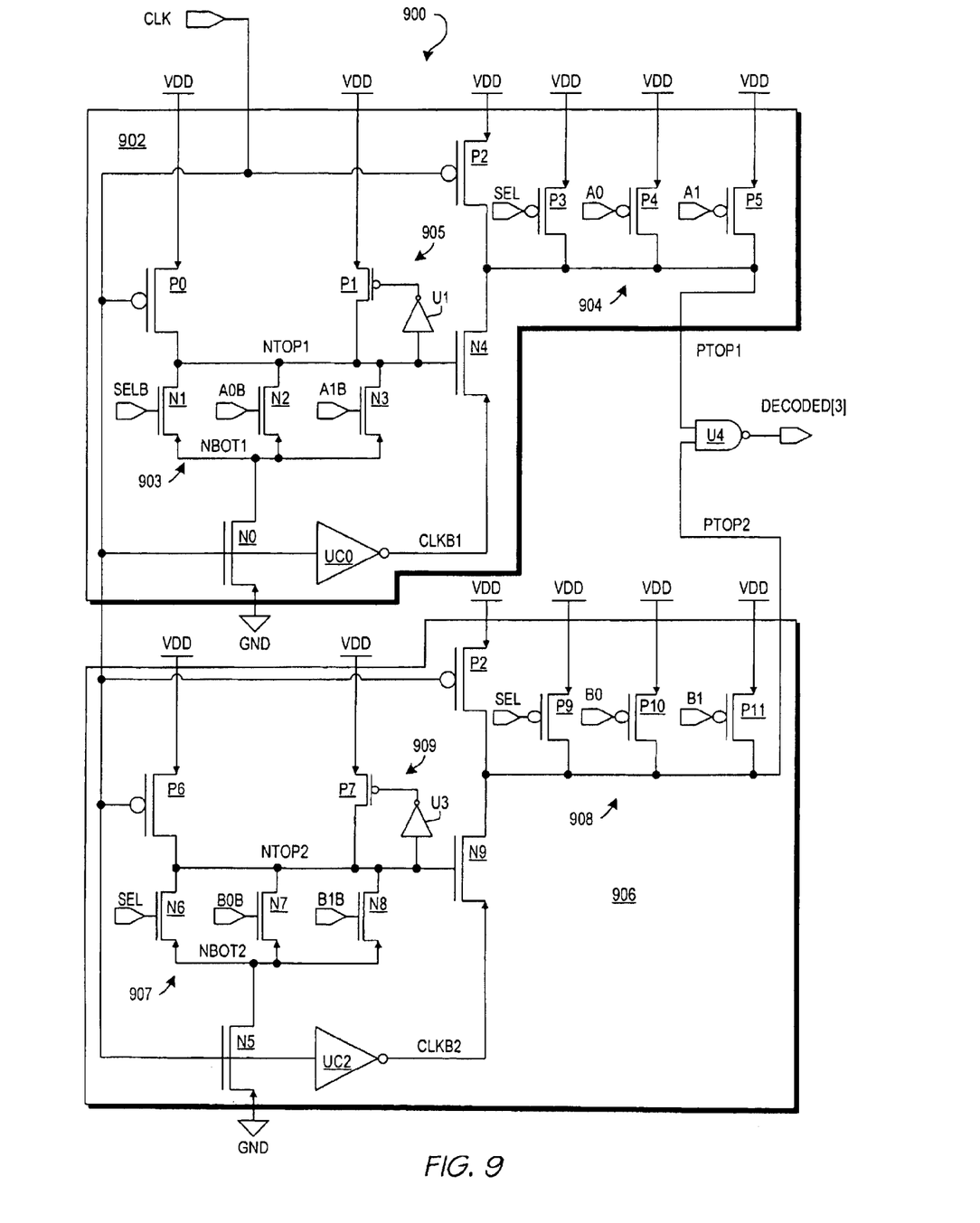
FIG. 9 is a schematic diagram of an exemplary complementary input dynamic muxed-decoder circuit for determining the decoded state of an uppermost decoded bit.

FIG. 9 is a schematic diagram of an exemplary complementary input dynamic muxed-decoder circuit 900 for determining the decoded state of the uppermost decoded bit, or the DECODED[3] signal. The complementary input dynamic muxed-decoder circuit 900 includes first and second complementary input dynamic logic circuits 902 and 906, each implemented in a similar fashion as the complementary input dynamic logic circuit 400 previously described. In particular, the complementary input dynamic logic circuit 902 is similar to the complementary input dynamic logic circuit 400, except that the pass device N1 is renamed N4, the signals/nodes NTOP, NBOT, CLKB, and PTOP are renamed NTOP1, NBOT1, CLKB1, and PTOP1, respectively, the AND N-logic circuit 402 is implemented as an N-logic circuit 903 with three N-channel devices N1, N2 and N3 coupled in parallel, the AND P-logic circuit 406 is implemented as a P-logic circuit 904 with three P-channel devices P3, P4 and P5 coupled in parallel, the storage circuit 304 is replaced by substantially identical storage circuit 905, and the inverter/driver U2 is removed or otherwise replaced by a 2-input NAND logic gate/driver U4. The PTOP1 signal is provided to one input of the NAND logic gate/driver U4.

The complementary input dynamic logic circuit 906 is also similar to the complementary input dynamic logic circuit 400, except that the pass device N1 is renamed N9, the signals/nodes NTOP, NBOT, CLKB, and PTOP are renamed NTOP2, NBOT2, CLKB2, and PTOP2, respectively, the AND N-logic circuit 402 is implemented as an N-logic circuit 907 with three N-channel devices N6, N7 and N8 coupled in parallel, the AND P-logic circuit 406 is implemented as a P-logic circuit 908 with three P-channel devices P9, P10 and P11 coupled in parallel, the storage circuit 304 is replaced by substantially identical storage circuit 909, and the output inverter/driver U2 is removed and the PTOP2 signal is provided to the other input of the NAND logic gate/driver U4.

As shown, the complementary input dynamic logic circuits 902 and 906 each include a corresponding clock inverter/driver UC0 and UC2, respectively, for inverting the CLK signal and providing the respective inverted clock signals CLKB1 and CLKB2 for a distributed configuration. It is appreciated that a single clock buffer circuit may be employed instead providing a single buffered and inverted clock signal to each of the pass devices.

The gate of the N-channel device N1 receives an inverted version of the SEL signal, or SELB. The gates of the N-channel devices N2 and N3 receive inverted versions of the A0 and A1 signals, or A0B and A1B, respectively. In this manner, the complementary input dynamic logic circuit 902 realizes the logic value SEL•A0•A1. The gate of the N-channel device N6 receives the SEL signal, and the gates of the N-channel devices N2 and N3 receive inverted versions of the B0 and B1 signals, or B0B and B1B, respectively. In this manner, the complementary input dynamic logic circuit 906 realizes the logic value SELB•B0•B1. Thus, the complementary input dynamic muxed-decoder circuit 900 determines DECODED[3]= ENCODED[1]•ENCODED[0], which is asserted at the output of the NAND logic gate/driver U4.

The decoding of the A and B address bits is performed in parallel. The state of the SEL signal determines which of the decoded A or B outputs is selected and provided to the NAND gate U4. If the SEL signal is asserted (and SELB is negated), thereby selecting the A bits associated with the complementary input dynamic logic circuit 902, then the lower complementary input dynamic logic circuit 906 evaluates driving the PTOP2 output evaluation node high. And, if the A0 and A1 signals are high, then the pass device N4 turns on allowing the CLKB1 signal to drive the PTOP1 output evaluation node low, causing the DECODED[3] output signal to be asserted high.

In a full fast muxed-decoder for determining all of the bits DECODED[3:0], the complementary input dynamic muxed-decoder circuit 900 is duplicated four times, one for each of the bits, and the address bits provided to the N-channel and P-channel device inputs of the evaluation paths are selected as appropriate for the particular decoded output bit. The lower bits DECODED[2:0] are provided by performing logical AND operations on combinations of the input bits and their complements. For example, to realize the DECODED[2] bit, the complementary input dynamic muxed-decoder circuit 900 is duplicated and the signal inputs are substantially the same except that the address bits are swapped. In particular, the A0/A1 and A0B/A1B signals are swapped and the B0/B1 and B0B/B1B signals are swapped (i.e., A0 is provided to the gate of the N-channel device N2 rather than A0B, A0B is provided to the gate of the P-channel device P4 rather than A0, A1 is provided to the gate of the N-channel device N3 rather than A1B, A1B is provided to the gate of the P-channel device P5 rather than A1, B0 is provided to the gate of the N-channel device N7 rather than B0B, B0B is provided to the gate of the P-channel device P10 rather than B0, B1 is provided to the gate of the N-channel device N8 rather than B1B, and B1B is provided to the gate of the P-channel device P11 rather than B1).

Additional bits can be decoded by adding additional N-channel devices and P-channel devices in their respective evaluation paths (i.e., between nodes NTOPx/NBOTx and between nodes VDD/PTOPx, respectively, where "x" denotes the number of the parallel complementary input dynamic logic circuit). The MUX function can be increased to select from between more than two sets of inputs by adding parallel decoding stages and inputting logical combinations of the select signals to the parallel N-channel and P-channel devices in their respective evaluation paths.

The NAND gate U4 may be implemented in substantially the same manner as the complementary input dynamic logic circuit 400 with the sufficient number of inputs and an inverted output. The inverted output may be achieved by replacing the inverter/driver U2 of the complementary input dynamic logic circuit 400 with a non-inverting driver (not shown), or by adding another inverter (not shown) at the output. One skilled in the art will appreciate that employing the complementary input dynamic logic circuit 400 as the output NAND gate facilitates any number of addresses (e.g., greater than four) because of its high fan-in capability.

Figure 10:
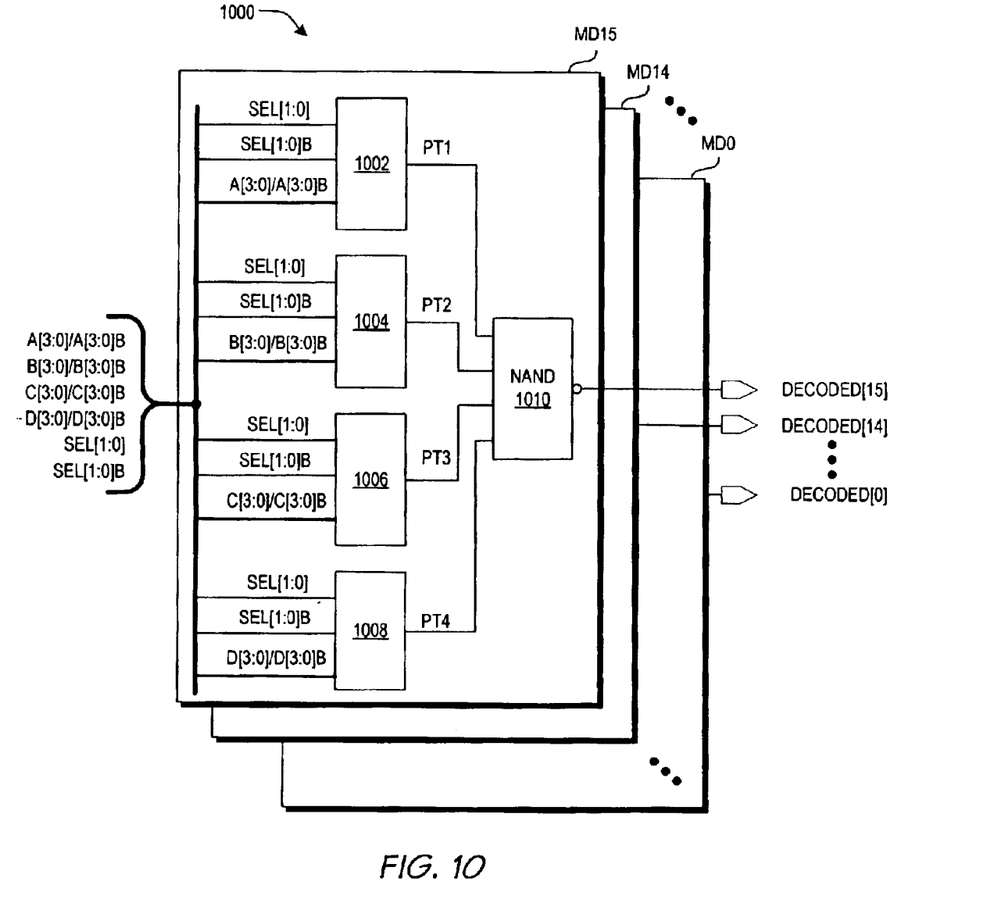
FIG. 10 is a simplified block diagram of an exemplary fast dynamic muxed-decoder implemented using complementary input dynamic logic circuits.

FIG. 10 is a simplified block diagram of an exemplary fast dynamic muxed-decoder 1000 implemented using complementary input dynamic logic circuits for decoding four, 4-bit addresses A[3:0], B[3:0], C[3:0] and D[3:0]. The dynamic muxed-decoder 1000 includes 16 complementary input dynamic muxed-decoder circuits MD15, MD14, . . . , MD0 (or MD[15:0], each for decoding a respective one of sixteen output decoded bits DECODED[15:0]. Each of the complementary input dynamic muxed-decoder circuits MD[15:0] is implemented in a similar manner as the complementary input dynamic muxed-decoder circuit 900, except including additional complementary input dynamic logic circuits for selecting from among a larger number of addresses. Also, each complementary input dynamic logic circuit within each complementary input dynamic muxed-decoder circuit includes additional N-channel and P-channel devices within the corresponding N-logic and P-logic circuits to decode additional select and address bits.

Each of the complementary input dynamic muxed-decoder circuits MD[15:0] are similar, so that only the detail of the first muxed-decoder circuit MD15 is shown. The address and select bits A[3:0], B[3:0], C[3:0], D[3:0] and SEL[1:0] and the corresponding inverted address and select bits A[3:0]B, B[3:0]B, C[3:0]B, D[3:0]B and SEL[1:0]B are provided to each of the complementary input dynamic muxed-decoder circuits MD[15:0]. The muxed-decoder circuit MD15 includes four complementary input dynamic logic circuits 1002, 1004, 1006 and 1008 for providing four output evaluation node outputs PT1, PT2, PT3 and PT4, respectively, to respective inputs of a 4-input NAND gate 1010. The output of the NAND gate 1010 provides the uppermost decoded bit DECODED[15].

The MUX function utilizes two select bits SEL[1:0] to select among the four addresses A, B, C and D, where address A is selected if SEL1 and SEL0 are both asserted (via logic circuit 1002), address B is selected if SEL1 is asserted and SEL0 is negated (via logic circuit 1004), address C is selected if SEL1 is negated and SEL0 is asserted (via logic circuit 1006), and address D is selected if both SEL1 and SEL0 are negated (via logic circuit 1008). Thus, the A address bits are provided to the logic circuit 1002, the B address bits are provided to the logic circuit 1004, the C address bits are provided to the logic circuit

1006, and the D address bits are provided to the logic circuit 1008. Each of the N-channel and P-channel evaluation paths include six devices, including two for select bits and four for address bits. The particular combination of select and address bits for each evaluation path is selected based on the particular output bit being decoded.

Dynamic muxed-decoders implemented using complementary input dynamic logic circuits according to embodiments of the present invention, such as the complementary input dynamic muxed-decoder circuit 900, are much faster in comparison to conventional muxed-decoders, such as the muxed-decoder 800. A muxed-decoder employing complementary input dynamic logic circuits according to embodiments of the present invention is expandable to greater numbers of decode bits and can be easily expanded to select from more than two sets of decode inputs.

In the general case for a full dynamic muxed-decoder, a number N of encoded addresses, each with a number M address bits, results in $2^M$ decoded output bits, where N and M are integers greater than one. A total of $2^M$ dynamic muxed-decoders are provided, each including N complementary input dynamic logic circuits for selecting from among the encoded addresses and decoding the selected address to provide a single decoded bit. Thus, the full muxed-decoder includes a total of $2^M$ groups of N complementary input dynamic logic circuits. Each complementary input dynamic logic circuit of each dynamic muxed-decoder receives the bits of one address and the inverted bits of the same address, in which the particular bit being decoded determines whether the address or its inverted counterpart are provided to the N-channel evaluation paths or the P-channel evaluation paths.

Furthermore, a number P of select bits are included, where P is an integer greater than zero sufficient to select from among the N encoded addresses. For example, P=1 for N=2 addresses, P=2 for N=3 or 4 addresses, P=3 for N=5 to 8 addresses, and so on. Each of the P select bits are provided in each P-channel and N-channel path of each complementary input dynamic logic circuit. The particular combination or logic state of the P bits in each evaluation path of each complementary input dynamic logic circuit is chosen to select the corresponding address being handled by that complementary input dynamic logic circuit. As shown for the dynamic muxed-decoder circuit 900, for example, the SEL signal is provided in a P-channel evaluation path whereas its inverted counterpart SELB is provided in the corresponding N-channel evaluation path in the complementary input dynamic logic circuit 902 for selecting the A address. The logic state of the select bits SEL/SELB is reversed (or inverted) in the complementary input dynamic logic circuit 906 for selecting the B address.

Although the present invention has been described in considerable detail with reference to certain preferred versions thereof, other versions and variations are possible and contemplated. For example, the particular logic state of an output signal may be inverted depending upon usage in the logic circuit. Moreover, although the present disclosure contemplates application to metal-oxide semiconductor (MOS) type devices, including complementary MOS devices and the like, such as, for example, NMOS and PMOS transistors, it may also be applied in a similar manner to analogous types of technologies and topologies, such as bipolar devices and the like.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

What is claimed is:

1. A muxed-decoder circuit, comprising:
    a plurality of complementary input dynamic circuits, each associated with a corresponding one of a plurality of multi-bit encoded addresses and with a corresponding one of a plurality of decoded bits, each complementary input dynamic circuit comprising:
        a complementary P-logic AND dynamic circuit, having an output coupled to a corresponding one of a plurality of output evaluation nodes, that evaluates bits of an address value corresponding to one of said plurality of encoded addresses and bits of a digital select value having a logic state for selecting said corresponding encoded address in response to a clock signal;
        a complementary N-logic AND dynamic circuit, having an output coupled to a corresponding one of a plurality of preliminary evaluation nodes, that evaluates inverted bits of said address value and inverted bits of said digital select value in response to said clock signal; and
        a pass device, coupled between said corresponding second evaluation node and said corresponding first evaluation node, that drives said corresponding second evaluation node low if said complementary N-logic AND dynamic circuit fails to evaluate; and
    an AND logic gate having a plurality of inputs, each coupled to a corresponding one of said plurality of output evaluation nodes and an output for providing a corresponding one of said plurality of decoded bits.

2. The muxed-decoder circuit of claim 1, further comprising at least one inverter/driver having an input receiving said clock signal and an output providing an inverted clock signal provided to said pass device.

3. The muxed-decoder circuit of claim 2, wherein said pass device comprises an N-channel pass device having a gate coupled to said corresponding preliminary evaluation node, a drain coupled to said corresponding output evaluation node and a source coupled to said output of said inverter/driver.

4. The muxed-decoder circuit of claim 2, wherein said at least one inverter/driver comprises a plurality of inverter/drivers, one for each of said plurality of complementary input dynamic circuits, each having an output coupled to a corresponding pass device.

5. The muxed-decoder circuit of claim 1 for selecting and decoding one of N encoded addresses each having M bits in which N and M are both integers greater than one, wherein said digital select value comprises P select bits in which P is an integer greater than zero sufficient to select from among said N addresses, further comprising:
    said plurality of complementary input dynamic circuits comprising $2^M$ groups of N complementary input dynamic circuits in which each one of said $2^M$ groups decodes a corresponding one of M decoded bits, each group including a set of N preliminary evaluation nodes and a set of N output evaluation nodes; and
    M AND logic gates including one for each group, each AND logic gate including N inputs coupled to a corresponding set of N output evaluation nodes and having an output for providing a corresponding one of said M decoded bits.

6. The muxed-decoder circuit of claim 1, wherein said complementary N-logic AND dynamic circuit comprises:
    a plurality of N-channel devices coupled in parallel between a corresponding preliminary evaluation node and a corresponding one of a plurality of reference nodes, each said N-channel device having an input for receiving either one of a select bit and an address bit;

a header device, receiving said clock signal and coupled to said corresponding preliminary evaluation node, that pre-charges said corresponding preliminary evaluation node when said clock signal is low; and a footer device receiving said clock signal and coupled to said corresponding reference node;

wherein said header and footer devices are responsive to said clock signal to enable said plurality of N-channel devices to evaluate.

7. The muxed-decoder circuit of claim 6, wherein:

said header device comprises a P-channel device having a source coupled to a source voltage, a gate receiving said clock signal and a drain coupled to said corresponding preliminary evaluation node; and wherein said footer device comprises an N-channel device having a source coupled to ground, a gate receiving said clock signal and a drain coupled to said corresponding reference node.

8. The muxed-decoder circuit of claim 6, further comprising a keeper circuit coupled between a source voltage and said corresponding preliminary evaluation node.

9. The muxed-decoder circuit of claim 1, wherein said complementary P-logic dynamic circuit comprises:

a plurality of P-channel devices coupled in parallel between a corresponding output evaluation node and a source voltage, each said P-channel device having an input for receiving either one of a select bit and an address bit; and a header device, receiving said clock signal and coupled to said corresponding output evaluation node, that pre-charges said corresponding output evaluation node when said clock signal is low and that enables said plurality of P-channel devices to evaluate when said clock signal is high.

10. The muxed-decoder circuit of claim 9, wherein said header device comprises a P-channel device having a source coupled to a source voltage, a gate receiving said clock signal and a drain coupled to said corresponding output evaluation node.

11. The muxed-decoder circuit of claim 1, wherein said AND logic gate comprises a NAND logic gate.

12. A complementary muxed-decoder circuit, comprising:

a plurality of complementary input dynamic circuits, each associated with a corresponding one of a plurality of multi-bit encoded addresses and with a corresponding one of a plurality of decoded bits, each complementary input dynamic circuit comprising:

a P-logic circuit comprising a plurality of P-channel devices coupled in parallel between a source voltage and a corresponding one of a plurality of output evaluation nodes and including a plurality of inputs for receiving a plurality of select and address bits;

an N-logic circuit comprising a plurality of N-channel devices coupled in parallel between a corresponding one of a plurality of preliminary evaluation nodes and a corresponding one of a plurality of reference nodes and including a plurality of inputs for receiving inverted versions of said plurality of select and address bits;

a first header device coupled to said output and a footer device coupled to said corresponding reference node of said N-logic circuit, said first header and footer devices being responsive to said clock signal to pre-charge said output of said N-logic circuit and to enable said N-logic circuit to evaluate;

a second header device coupled to said corresponding output evaluation node and being responsive to said clock signal to pre-charge said corresponding output evaluation node and to enable said P-logic circuit to evaluate; and a pass device, coupled to said corresponding output evaluation node and controlled by said corresponding preliminary evaluation node, that pulls said corresponding output evaluation node low if said N-logic circuit fails to evaluate; and an output gate having an output and a plurality of inputs, each input coupled to a corresponding one of said plurality of output evaluation nodes.

13. The complementary muxed-decoder circuit of claim 12, further comprising:

a clock inverter/driver having an input receiving said clock signal and an output providing a corresponding inverted clock signal; and wherein said pass device comprises an N-channel pass device having a gate coupled to said corresponding preliminary evaluation node, a source coupled to an output of said clock inverter/driver and a drain coupled to said corresponding output evaluation node.

14. The complementary muxed-decoder circuit of claim 12, further comprising:

a keeper circuit coupled between a source voltage and said corresponding preliminary evaluation node.

15. The complementary muxed-decoder circuit of claim 12, wherein said first header device comprises a first P-channel device having a source coupled to a source voltage, a gate receiving said clock signal and a drain coupled to said corresponding preliminary evaluation node, wherein said second header device comprises a second P-channel device having a source coupled to said source voltage, a gate receiving said clock signal and a drain coupled to said corresponding output evaluation node, and wherein said footer device comprises an N-channel device having a source coupled to ground, a gate receiving said clock signal and a drain coupled to said corresponding reference node.

16. A method of selecting from among a plurality of multi-bit encoded addresses and decoding at least one bit of a selected address, comprising:

for each address, combining each bit of a select value having a logic state for selecting a corresponding address with the bits of the corresponding address, forming a plurality of sets of AND terms;

evaluating a complement of an AND logic function for each set of AND terms using a plurality of complementary N-logic circuits, each complementary N-logic circuit pulling a corresponding one of a plurality of first evaluation nodes low if the corresponding complementary N-logic circuit evaluates;

evaluating a complement of an AND logic function for each set of AND terms using a plurality of complementary P-logic circuits, each complementary P-logic circuit pulling a corresponding one of a plurality of second evaluation nodes high if the P-logic circuit evaluates;

pulling a corresponding second evaluation node low via a corresponding one of a plurality of pass devices controlled by a corresponding one of the first evaluation nodes for every corresponding complementary N-logic circuit that fails to evaluate; and combining the second evaluation nodes using a gate to provide a decoded bit.

17. The method of claim 16, further comprising:

implementing each complementary N-logic circuit by coupling a plurality of N-channel devices in parallel between a corresponding first evaluation node and a reference node;

providing an N-channel footer device between each reference node and ground and controlling each footer device with a clock signal; and implementing each complementary P-logic circuit by coupling a plurality of P-channel devices in parallel between a corresponding second evaluation node and a source voltage.

18. The method of claim 16, wherein said pulling a corresponding second evaluation node low comprises:

inverting and buffering a clock signal and providing an inverted clock signal; and driving the corresponding second evaluation node with the inverted clock signal via a corresponding pass device.

19. The method of claim 16, further comprising keeping a corresponding first evaluation node pulled high to maintain activation of the corresponding pass device if the corresponding complementary N-logic circuit fails to evaluate.

20. The method of claim 16, wherein said combining the second evaluation nodes using a gate comprises using a NAND gate.

* * * * *